United States Patent [19]

Woldseth et al.

[11] Patent Number: 5,075,555
[45] Date of Patent: Dec. 24, 1991

[54] PELTIER COOLED LITHIUM-DRIFTED SILICON X-RAY SPECTROMETER

[75] Inventors: Rolf Woldseth, Foster City; Richard J. Bosson, Newark, both of Calif.

[73] Assignee: Kevex Instruments, San Carlos, Calif.

[21] Appl. No.: 565,793

[22] Filed: Aug. 10, 1990

[51] Int. Cl.$^5$ ............................ G01T 1/24; G01T 1/40
[52] U.S. Cl. ...................... 250/370.15; 250/370.06; 250/352; 62/51.1
[58] Field of Search ............ 250/370.15, 370.06, 250/352, 397; 62/51.1, 55.5

[56] References Cited

U.S. PATENT DOCUMENTS

| | | | |
|---|---|---|---|
| 4,230,945 | 10/1980 | Meir et al. | 250/370.15 |
| 4,361,011 | 11/1982 | Callender et al. | 62/3.2 |
| 4,587,563 | 5/1986 | Bendell et al. | 62/3.1 |
| 4,931,650 | 6/1990 | Lowe et al. | 250/370.15 |
| 4,933,557 | 6/1990 | Perkins et al. | 250/505.1 |

FOREIGN PATENT DOCUMENTS

| | | | |
|---|---|---|---|
| 2347823 | 4/1975 | Fed. Rep. of Germany | 250/370.15 |
| 951072 | 4/1964 | United Kingdom | 250/370.15 |

*Primary Examiner*—Carolyn E. Fields
*Assistant Examiner*—Drew A. Dunn
*Attorney, Agent, or Firm*—Thomas E. Schatzel

[57] ABSTRACT

For use as a substitute for liquid nitrogen cooled energy dispersive x-ray detection in spectrometry, the present invention comprises a cooper cold-finger having a lithium-drifted silicon detector and FET at one end, and a five-stage Peltier cooling stack thermally connected to the fifth stage through copper braid at the other end, an aluminum heat shield surrounding the cold-finger and thermally connected to the fourth stage of the Peltier cooling stack with a copper braid, a plurality of nylon spiders that support the cold finger within the heat shield and isolate them thermally, a stainless steel cap, a plurality of nylon spiders that support the heat shield within the cap and thermally isolates them, a heat sink in thermal communication with the hot end of the cooling stack, a remote water cooling system piped to the heat sink and mechanically isolated from vibrating the silicon detector, an ion pump to create a high-quality vacuum around the silicon detector, a motor drive to adjust the reach of the silicon detector assembly, a heat sensor, and a tip proximity sensor.

21 Claims, 2 Drawing Sheets

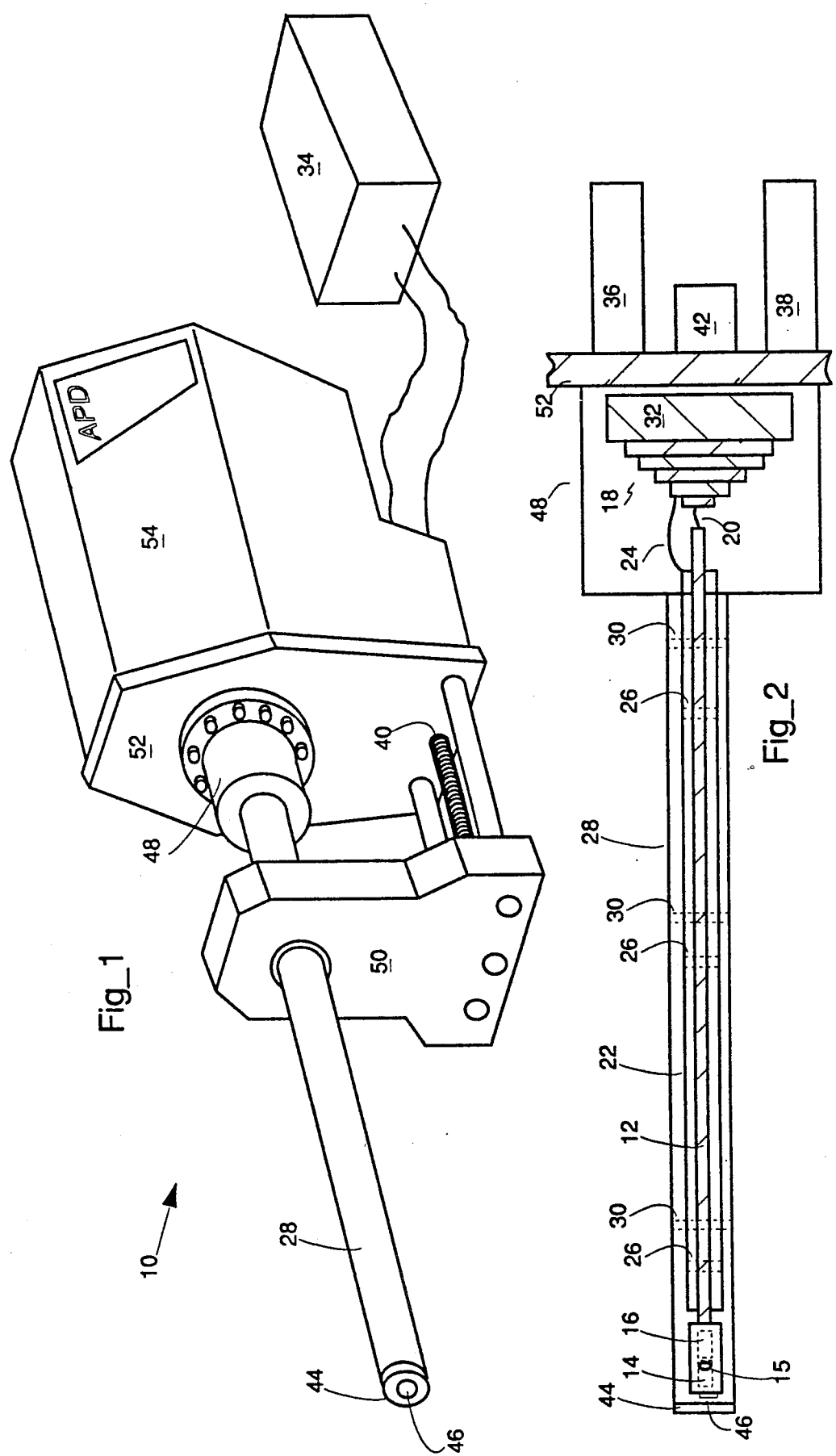

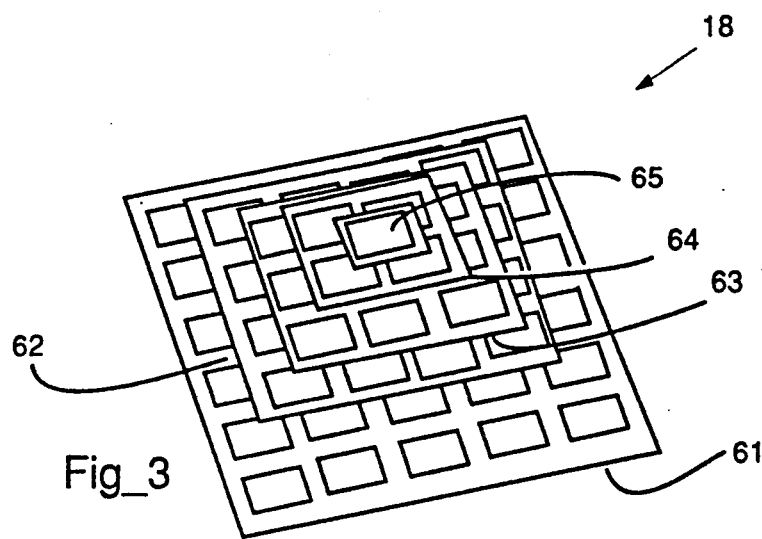
Fig_3
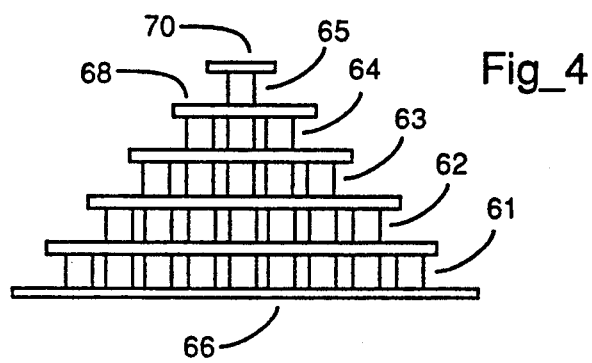
Fig_4
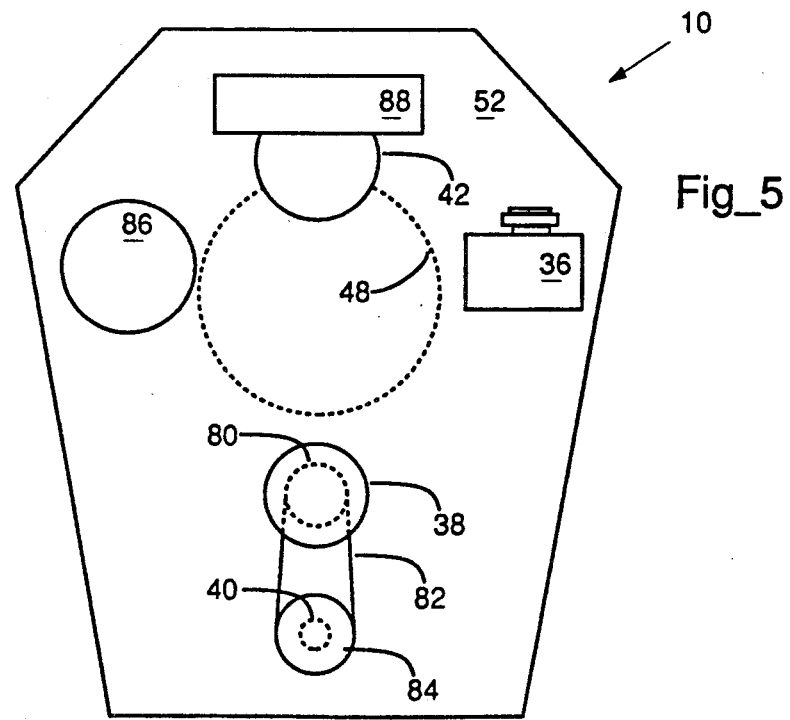
Fig_5

PELTIER COOLED LITHIUM-DRIFTED SILICON X-RAY SPECTROMETER

BACKGROUND OF THE INVENTION

1. Field of the Invention

The invention relates generally to x-ray microanalysis and more specifically to advanced performance energy dispersive lithium-drifted silicon x-ray detectors in spectrometry.

2. Description of the Prior Art

Low noise and consequent high resolution capabilities of lithium-drifted silicon (Si(Li)) x-ray spectrometers are achieved by operating a semiconductor detector and associated junction field effect transistor (JFET) at temperatures approximately that of liquid nitrogen (LN). Operation at low temperatures, typically −140° C., reduces the noise associated with thermally generated charge carriers in the semiconductor detector and JFET preamplifier. (See, Madden, et al., "A High Resolution Si(Li) Spectrometer with Thermoelectric Cooling," prepared for the U.S. Department of Energy under contract W-7405-ENG-48, and submitted to *Nuclear Instruments and Methods*, July 1978). In an early effort a detector was operated at temperatures in the range of −40° C. to −50° C. and a resolution of 1.6 keV full width at half maximum (FWHM) was attained. (Id., citing E. Belcarz et al., *Nukleonika 19* (1974) 1043; Translation: *Nukleonika 19* (1974) 13.)

A major disadvantage of cooling with LN is the necessity for a large, bulky reservoir, or dewar. Using LN is hazardous, inconvenient, and costly. Serious burns can result from skin contact with LN. The LN dewars must be constantly replenished in order to maintain the silicon crystal detector at operating temperatures. Typically, this must be done twice per week. X-ray detectors are usually mounted beyond easy reach, and refilling the LN dewar is often a dangerous operation. Users must carefully follow safety procedures or risk injury. The costs of purchasing, storing and handling liquid nitrogen over the lifetime of an x-ray detector can be very high. LN evaporates from both the detector dewar and from the storage tank. Also, during the refilling process, significant amounts of LN are lost due to evaporation and spillage. Thus, in addition to the expense of LN consumed by the detector itself, one must also add budget for LN lost to the atmosphere during dewar refilling and storage. About ten liters of LN per week evaporate from a standard detector dewar, and about the same amount is lost during transfer and evaporation from the storage tank. Therefore, a standard 160-liter storage tank lasts about eight weeks and must be refilled an average of 6.5 times per year. Annual costs of operating an LN-based detector are approximately $1,500 per year.

To the annual cost of LN must be added the labor for ordering and transferring LN, and refilling the detector dewar. Even if this labor averages only twenty minutes per week, it can add hundreds of dollars per year to the cost of servicing an LN-cooled x-ray detector. In addition, the handling of LN often requires that special liability insurance be purchased.

Prior art LN-cooled x-ray detectors are bulky, due to their (typical) nine liter dewars, and weigh over forty pounds. Placed on the end of a long support structure, an LN-cooled detector is cantilevered, and is prone to vibrate and interfere with high resolution imaging in its application on electron microscopes.

Some limited commercial use of Peltier cooled Si(Li) detectors in spectrometers is present in the prior art. Such detectors were generally limited to x-ray diffraction goniometer use. Madden, et al, report some usefulness in energy-dispersive x-ray fluorescence analysis, although with resolution less than that achievable with LN cooling. (Madden, et al., supra.) The short snoots of the prior art prohibited their use in high resolution SEM's. The long snoots needed in SEM applications of x-ray detectors were not practical, because the lever arm of a longer snoot would twist the Peltier cooling device and crack it, and also because fan motor vibrations would be amplified by the long snoot and would degrade SEM performance. In 1985, Kevex Instruments (San Carlos, CA) introduced a Peltier cooled energy dispersive x-ray detector. Called the "Psi," this detector could perform x-ray diffraction where LN cooled detectors could not. It too had a short snoot. The Psi succeeded were LN detectors could not, because LN dewars were too heavy to place on a goniometer arm. (Previous to the Kevex Psi, x-ray diffraction had to be performed by scintillation or gas proportional detectors and graphite monochromators). Even though the prior art short snoot detectors had fewer challenges to face with radiated and conducted heat getting in from the outside to the Si(Li) detector, these detectors had relatively high operating temperatures on the order of −80° C. to −82° C. Multi-stage electromechanical chiller cooled detectors produced by Kevex (supra), beginning in 1986, offered good resolution and low vibration in SEM applications. Resolution better than 149 eV FWHM at 5.9 keV at 2000 cps was guaranteed, but compressor vibration from a refrigeration system caused microphonics in the detector that vibrated SEM's and caused image resolution to deteriorate at high magnification. Under these conditions, LN-cooled detectors were recommended.

Prior art Peltier cooled detectors generally used forced air-cooling in combination with a heat sink attached to the Peltier device. Fans used to force air circulation, and compressor motors in other configurations, induced mechanical vibrations into the detectors that used them, and long snoots would amplify any vibrations that were present at the mounting base. These vibrations are enough to degrade SEM performance to the point where results are unacceptable.

The prior art of Peltier cooling of lithium-drifted silicon detectors made use of a slightly warmer heat shield to cut down on the radiated heat absorbed by the detector and its connection to the cooling device. The technique is conventional. Madden, et al., describe a method of attaching a JFET and Si(Li) detector to a coldest stage of a thermoelectric module and a heat shield that surrounds the detector to a second coldest stage of the thermoelectric module. (Madden, et al.,supra.)

SUMMARY OF THE PRESENT INVENTION

It is therefore an object of the present invention to provide a detector that eliminates the risks and costs associated with using liquid nitrogen and with filling liquid nitrogen dewars.

It is a further object of the present invention to provide a detector that reduces maintenance costs over liquid nitrogen systems.

It is a further object of the present invention to provide a detector that eliminates the microphonics associated with a long detector snoot.

It is a further object of the present invention to provide a detector that provides a more convenient design.

It is a further object of the present invention to provide a detector that eliminates the breaking of the Peltier cooling stack by shear forces resulting from twisting or levering the cold finger.

It is a further object of the present invention to provide a detector that does not affect the quality of an electron microscope's performance.

It is a further object of the present invention to provide a detector that enables superior peak resolution.

Briefly, a preferred embodiment of the present invention comprises a copper cold-finger having a lithium-drifted silicon detector and FET at one end, and a five-stage Peltier cooling stack thermally connected to the fifth stage through copper braid at the other end, an aluminum heat shield surrounding the cold-finger and thermally connected to the fourth stage of the Peltier cooling stack with a copper braid, a plurality of nylon spiders that support the cold finger within the heat shield and isolates them thermally, a stainless steel cap, a plurality of nylon spiders that support the heat shield within the cap and thermally isolates them, a heat sink in thermal communication with the hot end of the cooling stack, a remote water cooling system piped to the heat sink and mechanically isolated from vibrating the silicon detector, an ion pump to create a high-quality vacuum around the silicon detector, a motor drive to adjust the reach of the silicon detector assembly, a heat sensor, and a tip proximity sensor.

An advantage of the present invention is that liquid nitrogen is eliminated as are the risks associated with LN. Detectors incorporating the present invention are safer to operate.

Another advantage of the present invention is that no vibration is introduced that will interfere with an observation of a sample under analysis.

Another advantage of the present invention is that a preferred embodiment weighs only fifteen pounds and does not affect the quality of an electron microscope's performance.

Another advantage of the present invention is that maintenance and insurance costs are reduced. Another advantage of the present invention is that Peltier cooling stack breaking is reduced or eliminated.

Another advantage of the present invention is that resolution and performance are retained following extended temperature cycling.

Another advantage of the present invention is that superior peak resolution is demonstrated.

Another advantage of the present invention is that detector bias is immediately shut-off during periods the detector is not at its operating temperature.

Another advantage of the present invention is that a preferred embodiment may be cycled from operating temperature to room temperature at least once per week, with power off being 48 hours or longer without adverse effects. Such temperature cyclings have shown to cause no measurable degradation of resolution or light element sensitivity.

Another advantage of the present invention is that a preferred embodiment of a detector may be made portable for field use.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a perspective view of an advanced performance detector incorporating the present invention;

FIG. 2 is a cross section of a cap and housing assemblies of the detector of FIG. 1, taken along the longitudinal center line of the cap;

FIG. 3 is a perspective view of a multi-stage Peltier cooling stack;

FIG. 4 is side view of the multi-stage Peltier cooling stack of FIG. 3; and

FIG. 5 is an end view opposite to the cap of the advanced performance detector of FIG. 1, and with the cover removed to expose the major internal components mounted to the base plate.

DETAILED DESCRIPTION OF THE PREFERRED EMBODIMENT

A preferred embodiment of the present invention is a detector used in spectrometry. Referring now to FIGS. 1 and 2, an advanced performance detector (APD), referred to by the general reference numeral 10, comprises a solid copper cold-finger 12 having a lithium-drifted silicon detector 14 and a FET 16 at one end. For higher performance, detector 14 has a guard ring 15 encircling it. The detector 14 active area can be ten, thirty, or fifty square millimeters, depending on a particular application, and the guard ring is sized accordingly. Other active area sizes are also possible. When operated in the grounded guard ring configuration, the effect of surface leakage on the system noise is drastically reduced and leakage in the central region becomes the dominant noise source. The fifth (coldest) stage of a five-stage Peltier cooling stack 18 is thermally connected through at least one copper braid 20 to the other end of cold finger 12. An all aluminum heat shield 22, in the form of a hollow tube, surrounds the cold-finger 12 and is thermally connected to a fourth stage of the Peltier cooling stack 18 with at least one copper braid 24. A plurality of nylon spiders 26, similar in shape to O-rings with four outside points, mechanically support the cold finger 12 within the heat shield 22 and at the same time thermally isolates the cold finger 12 from the outside. A stainless steel cap 28, in the form of a hollow tube, has a plurality of nylon spiders 30, similar to spiders 26, that support the heat shield 22 within the cap 28 and thermally isolates the heat shield 22 from the outside. Cap 28 is typically approximately sixteen inches long. However, other lengths are possible, and will depend mainly on the particular application. This would include extended tap arrangements that feature a chisel-nose (angled detector window mount) configuration. Certain applications will also require an angled drop-nose configuration. A solid copper heat sink 32 with internal passageways for cooling water flow, is in thermal communication with the hot end of the cooling stack 18. A remote water cooling system 34 is piped to the heat sink 32 and as such is mechanically isolated from vibrating the silicon detector 14. Such vibrations, if present, could degrade the performance of a scanning electron microscope (SEM). Water is pumped through heat sink 32 and cooled by air flow through a radiator and water pump (not shown) contained within cooling system 34. An ion pump 36 is used to create a high-quality vacuum around the silicon detector 14. The vacuum must be good enough to prevent significant cryoabsorption by the detector 14 at its operating temperature of −90° C. to −100° C. This vacuum will typically be $10^{-8}$ torr. A motor drive 38 and a threaded lead screw 40 are used to adjust the reach of the APD 10. A heat sensor 42 will shut off detector 14 and remove the bias on FET 16 if detector 14 is not at its operating temperature. This protection extends the service lives of detector 14 and FET 16. A tip proximity sensor 44 is located near the free end of cap 28. A boron-nitride window 46 at the end of cap 28 seals the silicon detector 14 inside the vacuum, and yet allows even low energy photons to pass through it without being absorbed. Window 46 is superior to the prior art beryllium windows in this regard. However, in some applications beryllium windows will be satisfactory. A housing 48, cap 28, and window 46 together maintain the vacuum within. An adaptor plate 50 is acted against by lead screw 40 when motor drive 38 operates, and will change the distance between adaptor plate 50 and a base plate 52. This effectively lengthens and shortens the reach of cap 28 beyond adaptor plate 50. The proximity sensor 44 will disable motor drive 38 if the free end of cap 28 comes into contact with a foreign object. This prevents damage to APD 10. Motor drive 38 can also be operated to automatically withdraw APD 10 from a crowded area within a SEM. A cover 54 attaches to the rear of base plate 52 and protects the assemblies within. Cover 54 is very much smaller than the prior art LN dewars that it seems to resemble.

In FIGS. 3 and 4, Peltier cooling stack 18 is comprised of a first stage 61, a second stage 62, a third stage 63, a fourth stage 64, and a fifth stage 65. Heat is pumped from stage 65 to stage 61 in the five successive stages by exploitation of the Peltier semiconductor cooling effect which is well known in the art. Each stage 61-65 will have a 20° C. to 25° C. temperature differential across it during operation. Electrical current for the cooling stack 18 is supplied through a high vacuum feedthrough (described below) from an external power supply (not shown). Regulating the electrical current to the cooling stack 18 will modulate the operating temperature. A surface 66 is in thermal communication with heat sink 32 and will carry heat away from cooling stack 18. A surface 68 is in thermal communication with heat shield 22 and operates 20° C. to 25° C. warmer than cold finger 12. Cold finger 12 is in thermal communication with a surface 70. Copper braids 20 and 24 are used instead of rigid connections from cold finger 12 and heat shield 22, respectively, to cooling stack 18 to prevent the long moment arms of cold finger 12 and heat shield 22 from breaking off stages 64 and 65. Peltier devices, such as cooling stack 18 are very brittle, and will not tolerate any significant shear forces.

FIG. 5 shows the relationship of the major components contained within cover 54 that are mounted to base plate 52. Motor drive 38 has a pulley 80 that drives a belt 82, which in turn, rotates a threaded pulley/bushing 84. Threaded lead screw 40 is pushed and pulled by pulley/bushing 84 climbing or descending the threads of lead screw 40, depending on what direction motor drive 38 is turning. Motor drive 38 is a direct current motor, and may be substituted with a stepper motor for precision positioning of the reach of APD 10. Ion pump 36 is powered by a conventional ion pump power supply (not shown) located within water cooling system 34. Ion pump 36 is connected to the vacuum contained within cap 28, window 46, and housing 48. A high vacuum feedthrough 86 electrically bridges a vacuum-to-atmosphere interface and allows the connection of FET 16 to a preamplifier 88, and the connection of cooling stack 18 to the external supply. Heat sensor 42 is mounted beneath and forward of preamplifier 88 and interlocks the operation of motor drive 38 as described above.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of protecting a Peltier cooling stack from breaking, comprising the steps of:
    supporting a cold finger, having at one end a lithium-drifted silicon detector, within a heat shield means for cutting down radiant heat absorption in said cold finger with a means for thermally isolating conductive heat flowing to said cold finger from said heat shield means;
    connecting said cold finger to a stage of the Peltier cooling stack by a thermally conductive means for transferring heat, said thermally conductive means being flexible; and
    connecting said heat shield means to a stage of the Peltier cooling stack by a thermally conductive means for transferring heat, said thermally conductive means being flexible.

2. The method of claim 1, wherein:
    connecting said thermally conductive means to said cold finger comprises using at least one copper braid.

3. The method of claim 1, wherein:
    connecting said thermally conductive means to said heat shield means comprises using at least one copper braid.

4. The method of claim 1, wherein:
    connection of said cold finger to said cooling stack is made at the coldest stage of said cooling stack.

5. The method of claim 1, wherein:
    connection of said heat shield means to said cooling stack is made at the second coldest stage of said cooling stack.

6. A method of eliminating vibration caused by a lithium-drifted silicon detector within a scanning electron microscope, comprising the steps of:
    cooling the lithium-drifted silicon detector with a multi-stage Peltier cooling stack;
    mounting said multi-stage Peltier cooling stack to a means for heat sinking;
    cooling said means for heat sinking with a closed circuit flow of liquid having a high specific heat; and
    cooling said liquid by means of a radiator having a forced air flow mechanically and physically remote from said lithium-drifted silicon detector such that vibrations in the cooling system are substantially isolated from said lithium-drifted silicon detector.

7. The method of claim 6, further comprising the steps of:
    connecting the lithium-drifted silicon detector with a cold finger to a stage of said multi-stage Peltier cooling stack by a flexible and thermally conductive means for transferring heat; and surrounding said cold finger with a heat shield means for reducing transfer of heat by radiation to a stage of said multi-stage Peltier cooling stack by a flexible and thermally conductive means for transferring heat.

8. The method of claim 6, further comprising the steps of:

dampening any pulses in said closed circuit flow of said liquid with a means for smoothing hydraulic pressures over time.

9. An energy dispersive x-ray spectrometer, comprising:

a lithium-drifted silicon detector;

a FET preamplifier in communication with the detector;

a cold finger having a first end adapted for mounting of the detector and the FET and a second end;

a heat shield means for reducing radiant heat transfer, the heat shield means having disposed within it the cold finger;

a cap having disposed within it the heat shield means, the heat shield being supported within the cap by a plurality of insulating spiders;

a multi-stage Peltier cooling stack in thermal communication at a cold end with said second end of the cold finger, and at a hot end with a heat sink;

a cooling system physically and mechanically remote from an assembly comprising the lithium drifted silicon detector, the cooling system having a closed circuit flow of liquid through said heat sink;

connecting means for thermally connecting the cold finger to the cooling stack, the connecting means substantially reducing the ability of the cold finger to act as a lever and crack the Peltier cooling stack; and flexible means for thermally connecting the heat shield means to the cooling stack.

10. The spectrometer of claim 9, wherein:
the cold finger is comprised of solid copper.

11. The spectrometer of claim 9, wherein:
the heat shield means is comprised of a tube of aluminum.

12. The spectrometer of claim 9, wherein:
the connecting means comprises at least one copper braid.

13. The spectrometer of claim 9, wherein:
the flexible means comprises at least one copper braid.

14. The spectrometer of claim 9, wherein:
said liquid is substantially all water.

15. The spectrometer of claim 9, wherein:
the multi-stage Peltier cooling stack has at least five stages.

16. The spectrometer of claim 9, further comprising:
a vacuum means for pumping down a vacuum of at least $10^{-8}$ torr, the vacuum surrounding the lithium-drifted silicon detector and within the cap.

17. The spectrometer of claim 9, further comprising:
a boron-nitride window through which photons may pass before being absorbed in the lithium-drifted silicon detector.

18. The spectrometer of claim 9, further comprising:
a positioning means for adjusting the depth of entry of the lithium-drifted silicon detector into a scanning electron microscope.

19. The spectrometer of claim 9, further comprising:
a scanning electron microscope.

20. The spectrometer of claim 9, further comprising:
an adapter means able to effectively lengthen and shorten the reach of the cap beyond an adaptor plate, the adaptor means able stop if the cap should come into contact with a foreign object, and the adaptor means able to withdraw the spectrometer from a scanning electron microscope (SEM).

21. The spectrometer of claim 9, further comprising:
a guard ring around the lithium-drifted silicon detector.

* * * * *